United States Patent
Peng et al.

(10) Patent No.: US 7,382,621 B2
(45) Date of Patent: Jun. 3, 2008

(54) VIDEO GRAPHICS ARRAY (VGA) CARD ASSEMBLY

(75) Inventors: Xue-Wen Peng, Guangdong (CN); Rui-Hua Chen, Guangdong (CN)

(73) Assignees: Fu Zhun Precision Industry (Shen Zhen) Co., Ltd., Longhua Town, Boa'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 161 days.

(21) Appl. No.: 11/307,109

(22) Filed: Jan. 24, 2006

(65) Prior Publication Data

US 2007/0171611 A1 Jul. 26, 2007

(51) Int. Cl.
*H05K 7/20* (2006.01)
*H01L 23/34* (2006.01)
*F24H 3/02* (2006.01)

(52) U.S. Cl. .................... 361/719; 165/121; 257/719; 361/695

(58) Field of Classification Search .................... None
See application file for complete search history.

(56) References Cited

U.S. PATENT DOCUMENTS

| | | | |
|---|---|---|---|
| 5,473,510 A * | 12/1995 | Dozier, II | 361/719 |
| 6,151,214 A | 11/2000 | Yeh | |
| 6,449,162 B1 * | 9/2002 | Corbin et al. | 361/719 |
| 6,545,879 B1 * | 4/2003 | Goodwin | 361/807 |
| 6,611,430 B1 * | 8/2003 | Richard et al. | 361/704 |
| 6,654,254 B2 | 11/2003 | Szu | |
| 6,778,391 B2 | 8/2004 | Inoue | |
| 7,019,974 B2 * | 3/2006 | Lee et al. | 361/700 |
| 7,126,826 B1 * | 10/2006 | Sorensen et al. | 361/719 |
| 7,142,422 B2 * | 11/2006 | Lee et al. | 361/695 |
| 2004/0037042 A1 * | 2/2004 | Hockanson et al. | 361/704 |
| 2006/0007659 A1 * | 1/2006 | Lee et al. | 361/704 |
| 2006/0164808 A1 * | 7/2006 | Stefanoski | 361/700 |
| 2007/0047211 A1 * | 3/2007 | Refai-Ahmed et al. | 361/720 |

* cited by examiner

*Primary Examiner*—Gregory D Thompson
(74) *Attorney, Agent, or Firm*—Winston Hsu

(57) ABSTRACT

A VGA card assembly comprises a VGA card (10) having a socket (13) thereon. A GPU (11) is attached on the socket. A base plate (22) is located on the VGA card and contacts with the GPU, for dissipating heat generated by the GPU. A back plate (30) is located below the VGA card, for supporting the VGA card. The back plate has studs extend upwardly through the VGA card. Fasteners extend downwardly through the socket to threadedly engage with the studs. Screws extend downwardly through the base plate to threadedly engage with the fasteners. A heat dissipation device including a fan, a heat pipe, fins and a lid is removably mounted on the base plate.

16 Claims, 5 Drawing Sheets

VIDEO GRAPHICS ARRAY (VGA) CARD ASSEMBLY

FIELD OF THE INVENTION

The present invention relates to a video card assembly and particularly a video card assembly having a graphics processing unit (GPU) which can be easily disassembled from the assembly for being replaced or repaired and which can be effectively cooled by a heat dissipation device.

DESCRIPTION OF RELATED ART

In order to enable desktop and other computer devices to rapidly process graphics and game software, "graphics cards" or "VGA cards" are often installed in the computer devices. A VGA card includes a central processor which is called a GPU (graphics processor unit). However, a conventional GPU is generally mounted on a VGA card by soldering. When the GPU needs to be upgraded or repaired, it requires to de-solder the GPU whereby the GPU can be removed from the VGA card. The de-soldering process is a time-consuming process and must be carefully performed; otherwise, the GPU may be damaged. Thus, a VGA card with a GPU, which can be easily mounted to and removed from the VAG card is required.

SUMMARY OF INVENTION

According to a preferred embodiment of the present invention, a video graphics array (VGA) card assembly includes a socket thereon. A graphics processing unit (GPU) is attached on the socket. A base plate is located on a VGA card of the assembly and contacts with the GPU, for dissipating heat generated by the GPU. A back plate is located below the VGA card, for supporting the VGA card. A separable interlocking device is formed between the VGA card, the base plate and the back plate to connect the VGA card, the base plate and the back plate together. The separable interlocking device includes studs extend upwardly from the back plate through the VGA card. Fasteners have lower outer threads extending through the socket and threadedly engaging with the studs. Screws extend downwardly through the base plate to threadedly engage in upper inner threads of the fasteners. The socket is fastened to the VGA card. Thus, the VGA card assembly provides an easy access to move the GPU therefrom, when the GPU needs repair or upgrade.

Other advantages and novel features of the present invention will become more apparent from the following detailed description of preferred embodiment when taken in conjunction with the accompanying drawings, in which:

DETAILED DESCRIPTION

Figure 1:
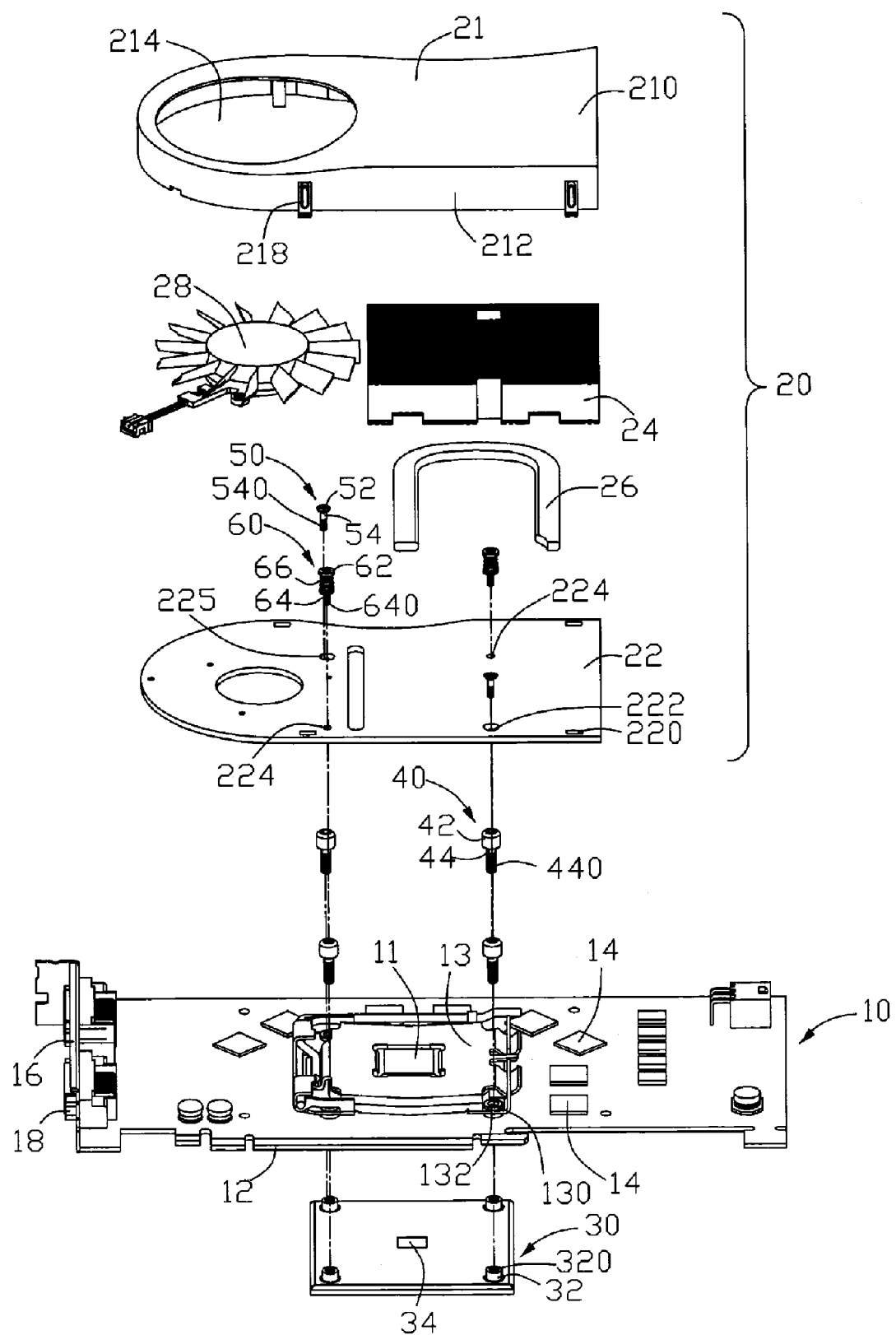
FIG. 1 is an exploded, isometric view of a video graphic card assembly according to a preferred embodiment of the present invention.

Referring to FIG. 1, a VGA card assembly in accordance with the present invention is illustrated, and comprises a VGA card 10, a heat dissipation device 20 mounted on the VGA card 10 and a back plate 30 mounted below the VGA card 10.

The VGA card 10 has an edge connector 12 (golden fingers in this preferred embodiment) and numerous electronic components 14 thereon. The edge connector 12 is for being inserted into a slot connector (not shown) in a computer (not shown) so that the VGA card 10 can electrically connect with a CPU (not shown) of the computer. An end plate 16 carrying cabling connectors 18 thereon is mounted to a rear end of the VGA card 10, for use in connecting with mating connectors (not shown) to communicate signals between the VGA card 10 and a periphery device (not shown). A socket 13 is attached on a top surface of the VGA card 10. The socket 13 has an approximately rectangular shape. Four corners of the socket 13 are installed with respective sleeves 130. Each sleeve 130 has a through hole 132, which is defined through the socket 13 and the VGA card 10. A graphics processor unit (GPU) 11 is mounted on a center of the socket 13 and connected electrically with the VGA card 10.

Figure 5:
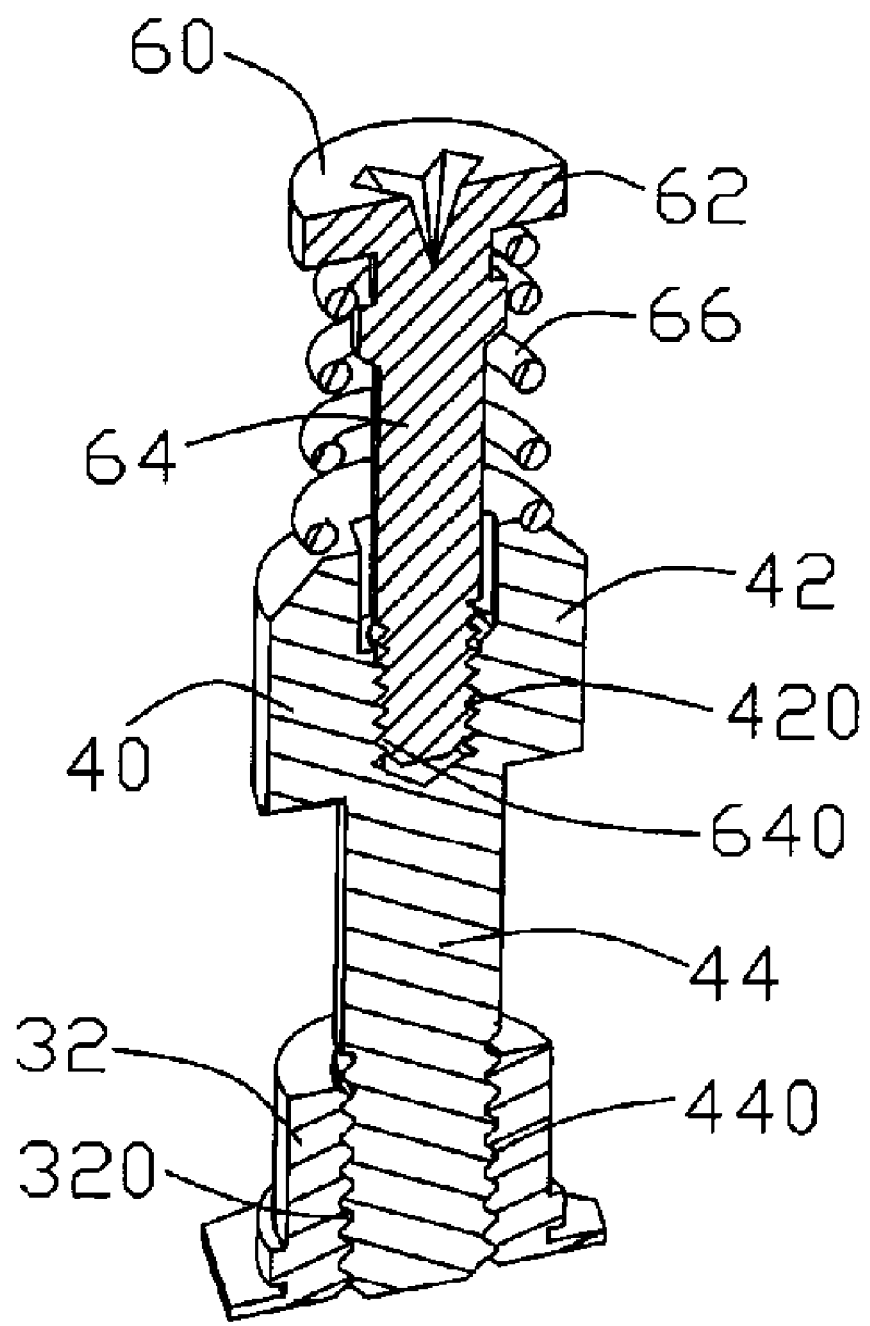
FIG. 5 is an enlarged perspective, cross-sectional view of a screw, a fastening member and a stud of the card assembly.

Also referring to FIG. 5, a plurality of fastening members 40 extends through the through holes 132, respectively. Each fastening member 40 has upper and lower ends protruding from a top face of the socket 13 and a bottom face of the VGA card 10, respectively. Each fastening member 40 comprises a cap 42 and a shaft 44 extending downwardly from the cap 42. The cap 42 forms internal threads 420 (shown in FIG. 5) on an internal surface thereof. The shaft 44 forms external threads 440 at a lower, free end thereof.

Figure 4:
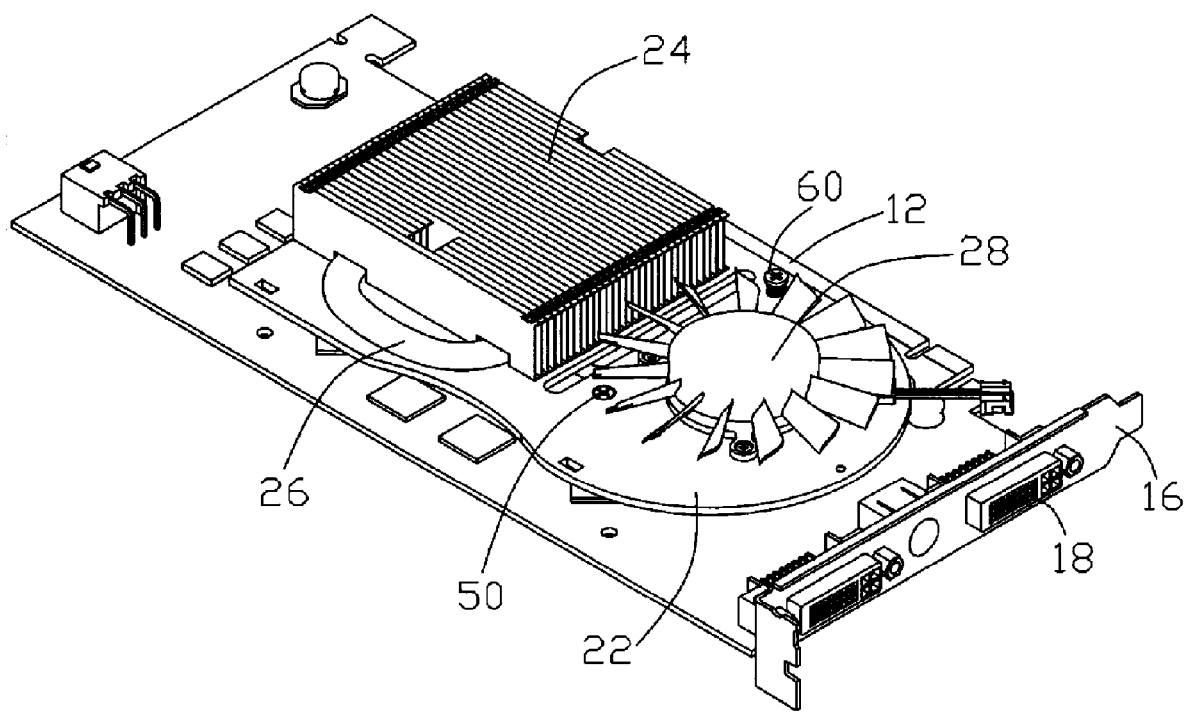
FIG. 4 is an assembled view of FIG. 1, but viewed from a different aspect, wherein a lid of a heat dissipation device of the assembly of FIG. 1 is removed.

Referring to FIG. 1 and FIG. 4, the heat dissipation device 20 is mounted onto the VGA card 10 for dissipating heat generated by the GPU 11 to achieve effective heat dissipation thereof. The heat dissipation device 20 mainly comprises a base plate 22, a plurality fins 24 soldered to the base plate 22, a flattened heat pipe 26 positioned between the base plate 22 and a bottom portion of the fins 24 and thermally connecting the base plate 22 and the fins 24, a fan 28 located on the base plate 22 and adjacent to channels of the fins 24, and a lid 21 mounted onto the base plate 22 and covering the fins 24, the fan 28 and the heat pipe 26.

The base plate 22 defines a plurality of locating holes 220 at an edge thereof, and a pair of diagonal through holes 224 and a pair of diagonal through holes 222 having countersinks 225 inside the through holes 222. Each of the though holes 224 has an internal diameter the same as that of each of the through holes 222. A pair of diagonal screws 50 extends through the through holes 222 and mates with the corresponding caps 42 of the fastening members 40. Each screw 50 has a head 52, and a shaft 54 having external threads 540 for threadedly engaging with the internal threads 420 of the cap 42 of the fastening member 40. The head 52 is received in the countersink 225, for preventing from interfering with the fan 28. A pair of screws 60 extends through the through holes 224 and mates with the corresponding caps 42 of the fastening members 40. Also referring to FIG. 5, each screw 60 comprises a head 62, and a shaft 64 having external threads 640 for threadedly engaging with the internal threads 420 of the cap 42 of the fastening member 40. A spring 66 is dimensioned to loosely fit around the shaft 64, and is compressed between the head 62 of the screw 60 and a top surface of the base plate 22 when the VGA card assembly is assembled.

Figure 2:
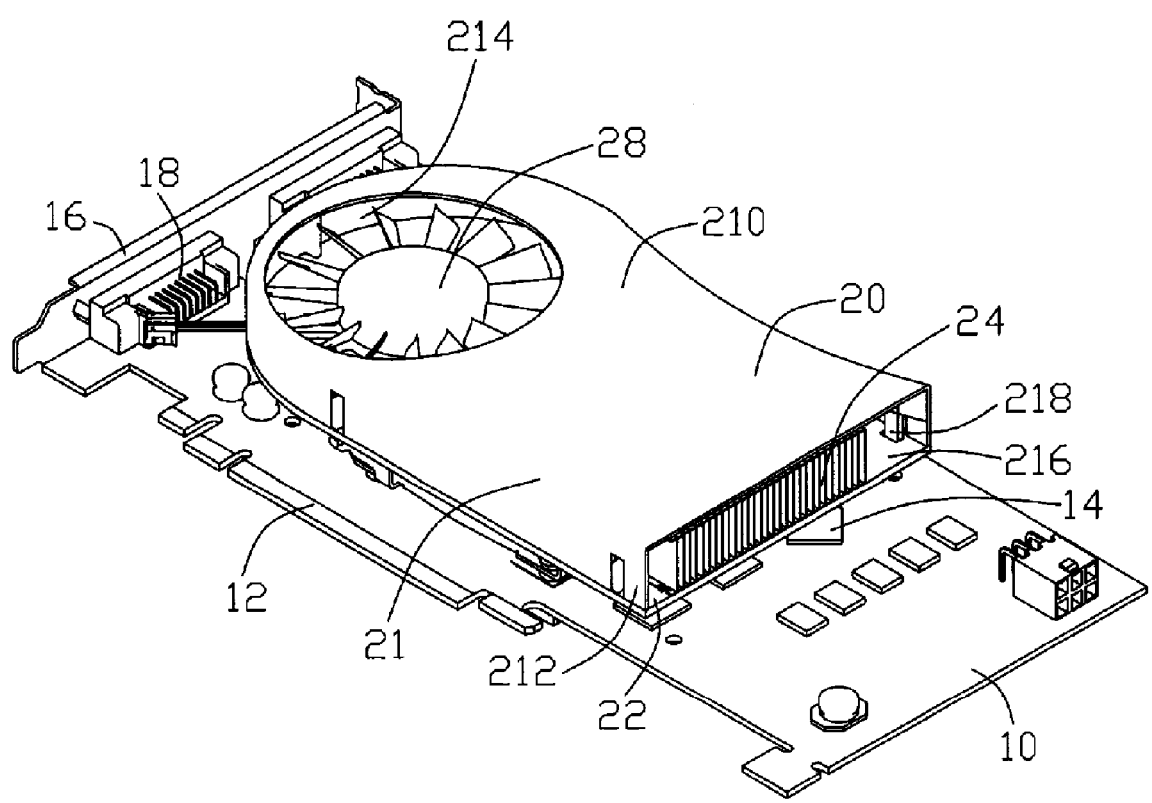
FIG. 2 is an assembled view of FIG. 1.

Referring to FIG. 1 and FIG. 2, the lid 21 comprises a top portion 210 and a lateral wall 212 extending downwardly from an edge of the top portion 210. An intake 214 is defined in the top portion 210, and is in alignment with the fan 28. The intake 214 is so large that it exposes the whole fan 28 in the present embodiment. An exhaust port 216 is defined between the lid 21 and the base plate 22, and is located distant from the fan 28. A plurality of tabs 218 is formed on the lateral wall 212 of the lid 21. The tabs 218 are used for fastening the lid 21 to the base plate 22 by clasping with the locating holes 220 in the base plate 22.

Figure 3:
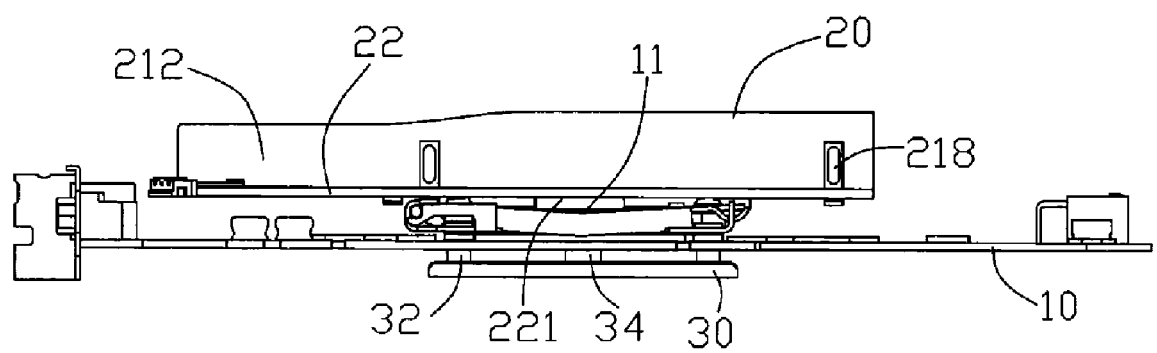
FIG. 3 is a side view of FIG. 2.

Also referring to FIG. 3, a heat conductive portion 221 is protruded downwardly from a bottom of the base plate 22. A top of the GPU 11 is connected to the heat conductive portion 221 through heat conductive medium, such as thermal tape or thermal grease. Therefore, the heat from the GPU 11 can be transferred to the base plate 22. The heat absorbed by the base plate 22 is distributed over the base plate 22 along the heat pipe 26, and is transferred to the fins 24. Meanwhile, cold air is blown to the fins 24 by the fan 28, when the fan 28 operates. Thus the heat accumulated on the fins 24 is dissipated and is ejected through the exhaust port 216. Accordingly, the heat of the GPU 11 is effectively and timely removed to ensure a stable and normal operation of the VGA card 10 even after a long period of use thereof.

The back plate 30 is installed below the VGA card 10, and has an approximately rectangular shape. Four corners of the back plate 30 are provided with respective studs 32 corresponding to the fastening members 40. The stud 32 has internal threads 320 therein, for threadedly engaging with the external threads 440 of the shaft 44 of the fastening member 40. The back plate 30 forms a protrusion 34 at a central portion thereof. The protrusion 34 extends upwardly for supporting a central portion of the VGA card 10 to prevent the VGA card 10 from being deformed downwardly. The fastening members 40 extend downwardly through the through holes 132 of the sleeves 130 of the socket 13, and protrude downwardly from the VGA card 10, and then are screwed to be connected to the studs 32. Thus, the back plate 30 is combined to the bottom of the VGA card 10.

In the present invention, the spring 66 is installed between the head 62 of the screw 60 and the base plate 22. By an elastic force of the spring 66, the base plate 22 is pushed to move downwards so that the heat conductive portion 221 at the bottom of the base plate 22 is pressed against the GPU 11 of the VGA card 10 by the elastic force of the spring 66. Therefore, the heat conductive portion 221 of the base plate 22 can have an intimate contact with the GPU 11 to effectively absorb the heat generated by the GPU 11.

The screws 50, 60 respectively extend through the through holes 222, 224 of the base plate 22 of the heat dissipation device 20 and threadedly engage with the caps 42 of the fastening members 40. Thus, the base plate 22 of the heat dissipation device 20 is fastened to the VGA card 10. The lid 21 is mounted on the base plate 22 after the tabs 218 clasp the locating holes 220 of the base plate 22. Therefore, the VGA card assembly of the invention is assembled together, which can be easily disassembled by manipulating the tabs 218 and the screws 50, 60. When the GPU 11 on the socket 13 needs repair or upgrade, the GPU 11 can be easily moved out of the VGA card assembly by firstly disassembling the heat dissipation device 20 from the VGA card assembly and then removing the GPU 11 from the socket 13.

In the present invention, the combination of the studs 32, the screws 50, 60 and the fastening members 40 acts as separable interlocking devices to provide a separable connection between the base plate 22, the VGA card 10 and the back plate 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic system, comprising:
   an add-on card having a socket thereon, an electronic element being attached on the socket, the electronic element being for processing video signals;
   a base plate located on the add-on card for dissipating heat generated by the electronic element;
   a back plate located below the add-on card for supporting the add-on card; and
   a separable interlocking device extending through the add-on card and the base plate and threadedly connecting the add-on card, the base plate and the back plate together;
   wherein the interlocking device comprises a plurality of fastening members which extend through the socket of the add-on card and protrude from the add-on card to threadedly engage with the back plate; and
   wherein the interlocking device further comprises a plurality of screws corresponding to the fastening members, each of the screws having external threads extending through the base plate and threadedly engaging with a corresponding fastening member.

2. The electronic system as described in claim 1, wherein the each of the screws comprises a head and a shaft, a spring dimensioned to loosely fit around the shaft of the each of the screws and compressed between the head of the each of the screws and a top surface of the base plate.

3. The electronic system as described in claim 1, wherein each of the fastening members comprises a cap and a shaft extending downwardly from the cap, the cap forming internal threads on an internal surface thereof, the internal threads threadedly engaging with the external threads of a corresponding screw, the shaft forming external threads at a free end thereof, the external threads threadedly engaging with the back plate.

4. The electronic system as described in claim 3, wherein corners of the back plate are provided with respective studs, each of the studs has internal threads therein, for threadedly engaging with the external threads of the shaft of a corresponding fastening member.

5. The electronic system as described in claim 1, wherein the back plate forms a protrusion at a central portion thereof, for supporting a central portion of the add-on card to prevent the card from being deformed.

6. The electronic system as described in claim 1 further comprising a heat dissipation device mounted on the base plate for dissipating heat generated by the electronic element.

7. The electronic system as described in claim 6, wherein the heat dissipation device comprises a plurality of fins mounted on the base plate, a heat pipe thermally connecting the base plate and the fins, a fan located on the base plate, and a lid mounted onto the base plate and covering the fins, the fan and the heat pipe.

8. The electronic system as described in claim 7, wherein the lid comprises a top portion and a lateral wall extending downwardly from an edge of the top portion, an intake is defined in the top portion and is in alignment with the fan.

9. The electronic system as described in claim 8, wherein a plurality of tabs is formed on the lateral wall of the lid, the base plate defines a plurality of locating holes, the tabs clasps the locating holes for fastening the lid to the base plate.

10. A video graphics array (VGA) card assembly, comprising:
a video graphics array (VGA) card having a socket thereon and a graphic processing unit (GPU) mounted on the socket;
a base plate contacting with the graphic processing unit (GPU) mounted on the socket, for dissipating heat generated by the GPU;
a separable interlocking device extending between the VGA card and the base plate, for threadedly connecting the base plate and the VGA card together; wherein the base plate has an intimate contact with the GPU; and
a back plate located below the VGA card to reinforce the VGA card;
wherein the interlocking device comprises a plurality of fastening members which extend through the socket of the VGA card and protrude from the VGA card to threadedly engage with the back plate.

11. The electronic system as described in claim 10, wherein the interlocking device further comprises a plurality of screws corresponding to the fastening members, each screw having external threads extending through the base plate and threadedly engaging with a corresponding fastening member.

12. The electronic system as described in claim 11, wherein each of the fastening members comprises a cap and a shaft extending downwardly from the cap, the cap forms internal threads on an internal surface thereof threadedly engaging with the external threads of a corresponding screw, the shaft forms external threads at a free end thereof threadedly engaging with the back plate.

13. The electronic system as described in claim 12, wherein corners of the back plate are provided with respective studs, each of the studs has internal threads therein, for threadedly engaging with the external threads of the shaft of a corresponding fastening member.

14. A VGA card assembly comprising:
a VGA card having a socket mounted thereon and a heat-generating electronic component mounted on the socket;
a back plate mounted to a bottom portion of the VGA card, the back plate having studs extending upwardly;
a plurality of fasteners having upper threaded portions and lower threaded portions extending downwardly through the socket to threadedly engage with the studs, thereby threadedly connecting the socket, the VGA card and the back plate together;
a base plate mounted on the VGA card and intimately contacting with the electronic component for absorbing heat from the electronic component; and
a plurality of screws extending through the base plate to threadedly engage with the upper threaded portions of the fasteners, thereby threadedly connecting the base plate and the VGA card together.

15. The VGA card assembly as described in claim 14 further comprising a plurality of fins mounted on the base plate, a heat pipe thermally connecting the base plate and the fins and a fan for generating an airflow flowing through the fins.

16. The VGA card assembly as described in claim 15 further having a lid mounted to the base plate and covering the fan, the fins and the heat pipe, the lid having an intake in alignment with the fan.

* * * * *